(12) United States Patent
    Spadaccini et al.

(10) Patent No.: US 8,871,338 B2
(45) Date of Patent: Oct. 28, 2014

(54) LATTICE-STRUCTURES AND CONSTRUCTS WITH DESIGNED THERMAL EXPANSION COEFFICIENTS

(75) Inventors: Christopher Spadaccini, Oakland, CA (US); Jonathan Hopkins, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 13/607,640

(22) Filed: Sep. 7, 2012

(65) Prior Publication Data

US 2013/0243997 A1   Sep. 19, 2013

Related U.S. Application Data

(60) Provisional application No. 61/532,067, filed on Sep. 7, 2011.

(51) Int. Cl.
    *B32B 1/06*     (2006.01)
    *F16L 59/21*    (2006.01)
    *B32B 3/08*     (2006.01)

(52) U.S. Cl.
    CPC ... *B32B 1/06* (2013.01); *B32B 3/08* (2013.01); *F16L 59/21* (2013.01)
    USPC .......................... 428/316.6; 428/134; 428/119

(58) Field of Classification Search
    CPC .............. B32B 1/06; B32B 3/08; F16L 59/21
    USPC ....................................... 428/116, 134, 316.6
    See application file for complete search history.

(56) References Cited

PUBLICATIONS

Sigmund, O.; Torquato, S.; "Design of smart composite materials using topology optimization," Smart Matererials and Structures. 1999, 8, 365-379.*
Steeves, C.; dos Santos e Lacato, S.; He, M.; Antinucci, E.; Hutchinson, J.; Evans, A.; "Concepts for structurally robust materials that combine low thermal expansion with high stiffness," Journal of the Mechanics and Physics of Solids. 2007, 55, 1803-1822.*
Sukava, et al., "Shrinkage and Thermal Expansion of a Two Phase Material", Nature, vol. 220, pp. 576-577 (Nov. 9, 1968).
Sigmund, et al, "Composites with External Thermal Expansion Coefficients", Appl. Phys. Lett., 69 (21), pp. 3203-3205, Nov. 18, 1996.
Lakes, "Cellular Solid Structures With Unbounded Thermal Expansion", Journal of Materials Science Letters, 15, 7 pages (1996).

(Continued)

*Primary Examiner* — Mark Ruthkosky
*Assistant Examiner* — Julia L Rummel
(74) *Attorney, Agent, or Firm* — James S. Tak

(57) ABSTRACT

A thermal expansion-managed lattice structure having a plurality of unit cells each having flexure bearing-mounted tabs supported on a base and actuated by thermal expansion of an actuator having a thermal expansion coefficient greater than the base and arranged so that the tab is inwardly displaced into a base cavity. The flexure bearing-mounted tabs are connected to other flexure-bearing-mounted tabs of adjacent unit cells so that the adjacent unit cells are spaced from each other to accommodate thermal expansion of individual unit cells while maintaining a desired bulk thermal expansion coefficient of the lattice structure as a whole.

18 Claims, 11 Drawing Sheets

(56) References Cited

PUBLICATIONS

Steeves, et al., "Concepts for Structurally Robust Materials That Combine Low Thermal Expansion With High Stiffness", ScienceDirect, Journal of the Mechanics and Physics of Solids, 55, pp. 1803-1822 (2007).

Lakes, "Ceillar solids with tunable positive or negative thermal expansion of unbounded magnitude", Applied Physics Letters, 90, 3 pages (2007).

Jefferson, et al., "Tailorable Thermal Expansion Hybrid Structures", International Journal of Solids and Structures, 46, pp. 2372-2387 (2009).

Hopkins, et al., "Synthesis of multi-degree of freedom, parallel flexure system concepts via Freedom and Constraint Topology (FACT)—Part I:Principles", Precision Engineering, 34, pp. 259-270 (2010).

Hopkins, et al., "Synthesis of precision serial flexure systems using freedom and constraint topologis (FACT)", Precision Engineering, 34, pp. 271-278 (2010).

Hopkins, et al., "Synthesis of multi-degree of freedom, parallel flexure system concepts via Freedom and Constraint Topology (FACT)—Part II:Practice", Precision Engineering, 34, pp. 271-278 (2010).

Hopkins, "Design of Flexure-based Motion Stages for Mechatronic Systems via Freedom, Actuation and Constraint Topologies (FACT)", Masters Thesis, Massachusetts Institute of Technology, (2007).

* cited by examiner

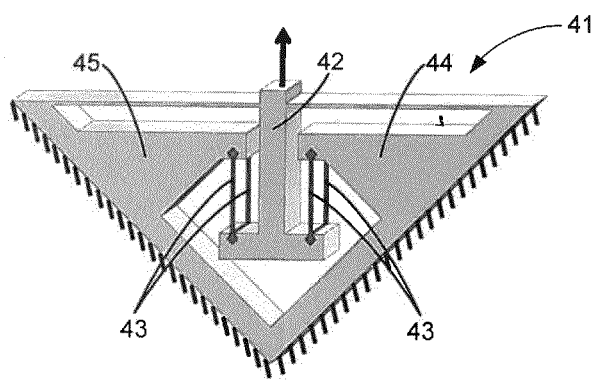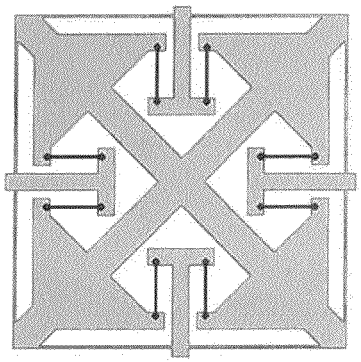
Figure 7A
Figure 7B
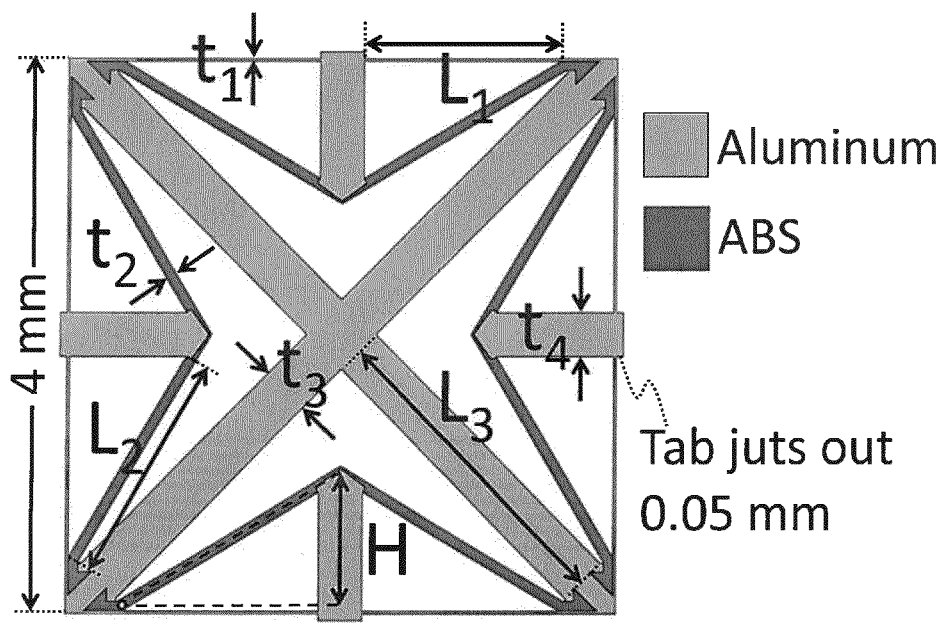
Figure 8

LATTICE-STRUCTURES AND CONSTRUCTS WITH DESIGNED THERMAL EXPANSION COEFFICIENTS

CROSS-REFERENCE TO RELATED APPLICATIONS

This patent document claims the benefits and priorities of U.S. Provisional Application No. 61/532,067, filed on Sep. 7, 2011, hereby incorporated by reference.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to materials having negative, low, or zero thermal expansion coefficients, and in particular to lattice-based architectures, materials, and constructs having unit cell structures with flexure bearings which accommodate thermal expansion in void spaces within and between the unit cells so that the lattice-structure material achieves desired bulk material properties such as positive, negative, or substantially zero thermal expansion coefficients.

BACKGROUND

Various types of microstructural architectures, including multi-material architectures that achieve superior thermal properties (e.g. extreme thermal expansion coefficients) from those of naturally occurring materials are known. Example types are described in, for example, (a) Lakes, R., *Cellular solid structures with unbounded thermal expansion*. Journal of Materials Science Letters, 1996. 15(6): p. 475-477; (b) Sigmund, O. and S. Torquato, *Composites with extremal thermal expansion coefficients*. Applied Physics Letters, 1996. 69: p. 3203; (c) Jefferson, G., T. A. Parthasarathy, and R. J. Kerans, *Tailorable thermal expansion hybrid structures*. International Journal of Solids and Structures, 2009. 46(11-12): p. 2372-2387; (d) Steeves, C. A., et al., *Concepts for structurally robust materials that combine low thermal expansion with high stiffness*. Journal of the Mechanics and Physics of Solids, 2007. 55(9): p. 1803-1822; (e) Cribb, J. L., Shrinkage and Thermal Expansion of a Two Phase Material. Nature, 1963. 220: p. 576-577; and (f) Lakes, R., Cellular solids with tunable positive or negative thermal expansion of unbounded magnitude. Applied Physics Letters, 2007. 90: p. 221905.

The basic topologies for many such microstructural architectures were, however, generated by way of creative thought and then their geometric parameters and material properties were later optimized using analytical expressions tailored to their specific topologies. No systematic analytical approach existed, which was capable of generating such design concepts from scratch. Designers, therefore, relied on topology optimization to numerically generate microstructural architecture concepts. Topology optimization utilizes a computer to iteratively construct a microstructural architecture that possesses properties, which most closely approach the desired target properties while satisfying specific constraint functions. The design space begins with an unorganized mixture of desired materials and a cost function is minimized until an optimal microstructural architecture is achieved, which consists of organized clumps of the materials. One of the biggest problems with topology optimization and the designs produced thereby is that designer can never be certain that the most optimal concept was identified. The cost function often bottoms out inside a local minimum instead of the global minimum, which corresponds to the truly optimal microstructural architecture. Furthermore, it is difficult to know which constraint functions to impose on the optimization, as vastly different concepts are generated depending on the constraint functions that are applied. Often, the computer generates microstructural architectures that possess impractical features, which are not possible to fabricate or implement. The reason for this deficiency is that the computer is not able to apply commonsense or creativity during the optimization process to recognize or generate functional concepts with practical features.

SUMMARY

The technology described in this patent document includes thermally activated structures, architectures, materials, and constructs which are capable of managing thermal expansion to achieve desired bulk thermal performance.

In one example implementation, a lattice structure comprises: a plurality of unit cells, each comprising a base, of a first material type and associated first thermal expansion coefficient, having at least three radially-positioned base cavities which are open in a radially outward direction at respective cavity openings, and for each base cavity: a flexible bridge connected to the base across the cavity opening; a tab connected to the flexible bridge so as to be guided thereby in a direction into or out of the base cavity; and an actuator, of a second material type and associated second thermal expansion coefficient greater than the first thermal expansion coefficient, operably connected to the tab and the base so that thermal expansion of the actuator inwardly displaces the tab into the base cavity along a tab displacement axis, wherein a tab of one unit cell is connected to a tab of an adjacent unit cell so that void spaces are formed between adjacent unit cells to accommodate thermal expansion of individual unit cells while maintaining a desired bulk thermal expansion coefficient of the lattice structure as a whole.

In another example implementation, a lattice structure comprises: at least two unit cells, each comprising a base, of a first material type and associated first thermal expansion coefficient, having at least two radially-positioned base cavities which are open in a radially outward direction at respective cavity openings, and for each base cavity: a flexible bridge connected to the base across the cavity opening; a tab connected to the flexible bridge so as to be guided thereby in a direction into or out of the base cavity; and an actuator, of a second material type and associated second thermal expansion coefficient greater than the first thermal expansion coefficient, operably connected to the tab and the base so that thermal expansion of the actuator inwardly displaces the tab into the base cavity along a tab displacement axis, wherein a tab of one unit cell is connected to a tab of an adjacent unit cell so that void spaces are formed between adjacent unit cells to accommodate thermal expansion of individual unit cells while maintaining a desired bulk thermal expansion coefficient of the lattice structure as a whole.

In another example implementation, a thermal expansion-managed structure comprises: a base, of a first material type and associated first thermal expansion coefficient, having at least three radially-positioned base cavities which are open in a radially outward direction at respective cavity openings; for each base cavity: a flexible bridge connected to the base across the cavity opening of the base cavity; a tab connected to the flexible bridge so as to be guided thereby in a direction into or out of the base cavity; and an actuator, of a second material type and associated second thermal expansion coefficient greater than the first thermal expansion coefficient, operably connected to the tab and the base so that thermal expansion of the actuator inwardly displaces the tab into the base cavity along a tab displacement axis.

These and other implementations and various features and operations are described in greater detail in the drawings, the description and the claims.

The present invention is generally direct to lattice-based structures and materials having designed thermal expansion coefficients, such as materials with architectural microstructures that have low or zero thermal expansion or even extreme negative thermal expansion coefficients. The basic construct use to form the lattice structures is a unit cell having a bi-material construction. The unit cell has several specially designed flexure and thermal actuation mechanisms which allows thermal expansion to be accommodated in void spaces resulting in an overall designed thermal expansion which can be either positive, negative, or zero. In particular, a tab of one unit cell is mounted on a flexure bearing and connected to a tab of an adjacent unit cell such that a void space is formed between the two unit cells, and a thermally expanding actuator having a higher thermal expansion coefficient than a base of the unit cell operates to actuate the tab and associated flexure into a base cavity. In an example embodiment, the actuator has a chevron, or V-shaped configuration. By changing the material of the chevron actuator and/or the flexure, a different range of properties can be achieved.

This unit cell is then repeated and used as the building block for the larger lattice of cellular material which exhibits the designed thermal expansion properties at the bulk scale. By designing a unit cell structure with both high and low expansion materials, growth or shrinkage of the lattice as a whole due to temperature changes can be accommodated locally by the void space or by small amounts of bending or twisting of a local structural member. The unit cell concept is tunable to a wide range of thermal expansion coefficients (and stiffness) by altering the material components and/or the structural components (thickness and length of struts etc), such as shown in the graph of FIG. 11.

The structural designs of the present invention may be produced using, for example but not limited to, the Freedom and Constraint Topologies (FACT) methodology described in (a) Hopkins J B, Culpepper M L. Synthesis of multi-degree of freedom, parallel flexure system concepts via freedom and constraint topology (FACT)—Part I: Principles. Precis Eng 2010; 34:259-270; (b) Hopkins J B, Culpepper M L, Synthesis of multi-degree of freedom, parallel flexure system concepts via freedom and constraint topology (FACT)—Part II: Practice. Precis Eng 2010; 34:271-278; (c) Hopkins J B, Culpepper M L, Synthesis of precision serial flexure systems using freedom and constraint topologies (FACT), Precis Eng 2011 PRE-D-10-00136R2; (d) Hopkins J B. Design of flexure-based motion stages for mechatronic systems via freedom, actuation and constraint topologies (FACT). PhD Thesis. Massachusetts Institute of Technology; 2010; and (e) Hopkins J B. Design of parallel flexure systems via freedom and constraint topologies (FACT). Masters Thesis. Massachusetts Institute of Technology; 2007.

The lattice-based structures and materials of the present invention with designed and controllable thermal expansion coefficients could have a broad array of possible uses. For materials with extremely small or zero thermal expansion, applications include, for example: anything that requires precision optic alignment and is thermally cycled; electrical packaging which often breaks when heat builds up (these designed materials may reduce the need for complex heat-sinking schemes; variation occurs in machined parts because the machine heats up over the course of the day and the expanding parts change the performance of the machine tool and thus the dimensions of the parts (designed thermal materials can eliminate this problem); any sub micron positioning stages where thermal expansion is a typical problem; and advanced, high-performance (kinematic, elastomechanic, and dynamic) precision flexure designs that can't be used for certain applications simply because they are not thermally stable (meaning you heat them up and they move in unintended directions). If the flexures where made of zero thermal expansion material, this would not be an issue and many flexures could be applied to ultra precise, small motion systems.

Moreover, the present invention may be designed as negative thermal expansion materials which can be used, for example, for: passive tracking of the sun for low power solar collectors; as many systems operate faster they rise in temperature. Roller bearings are an example of this. As the shaft of the bearing constraint spins faster, it gets hotter and the shaft and the bearings expand, however housing stays at ambient temperature because it is not moving fast and is exposed to the ambient air. As a result the housing does not expand and the thermal mismatch crunches the bearings and the shaft ultimately causing failure. If the shaft or bearings had a negative thermal expansion material, they would last longer with the potential to "never" fail due to thermal cycling; novel thermal actuators; novel thermal insulation material which expand and trap air when cooled and shrink are release air as they are heated; valves that pinch off when the fluid gets too hot; and a selective filter that is actuated by temperature.

BRIEF DESCRIPTION OF THE DRAWINGS

FIG. 7A is an isometric view of another example sector of a unit cell structure of the present invention.

FIG. 7B is a schematic view of an example embodiment of a unit cell structure of the present invention constructed from the sectors shown in FIG. 7A.

FIG. 8 is a schematic view of an example unit cell structure similar to FIG. 1, but shown with dimensional markings for a 4 mm example unit cell.

DETAILED DESCRIPTION

Figure 1:
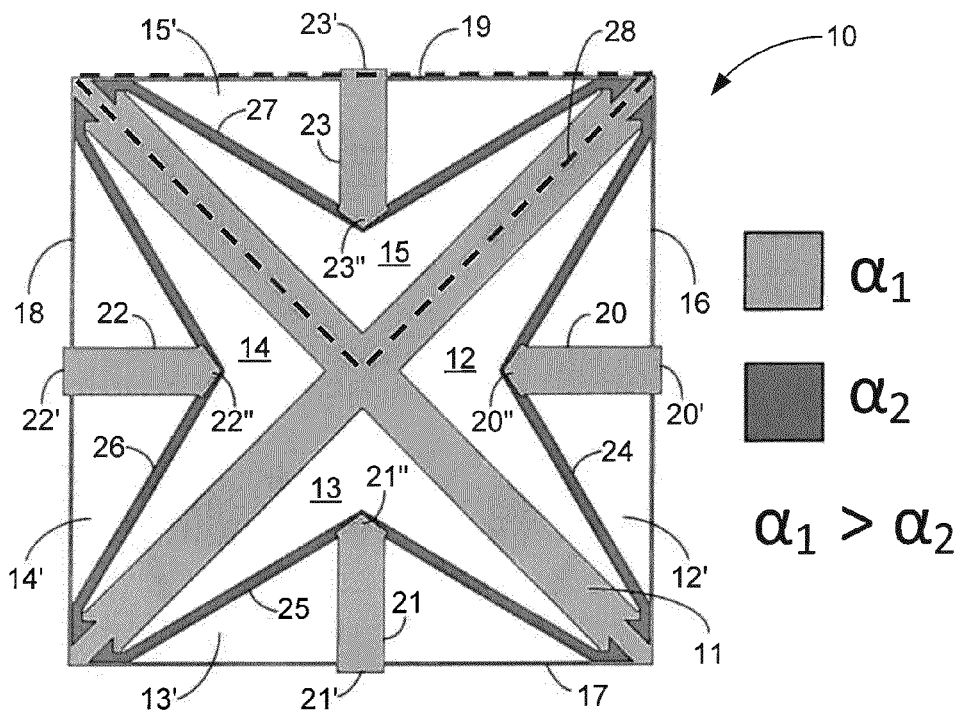
FIG. 1 is a schematic view of an example embodiment of the unit cell structure of the present invention.
Figure 2:
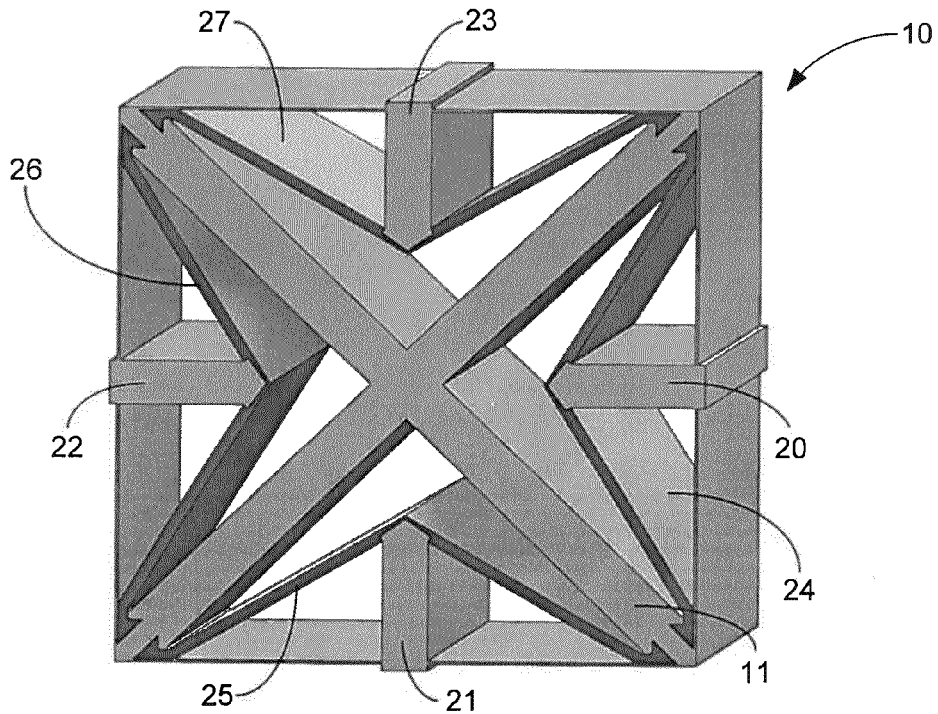
FIG. 2 is an isometric view of the unit cell structure of FIG. 1.
Figure 26:
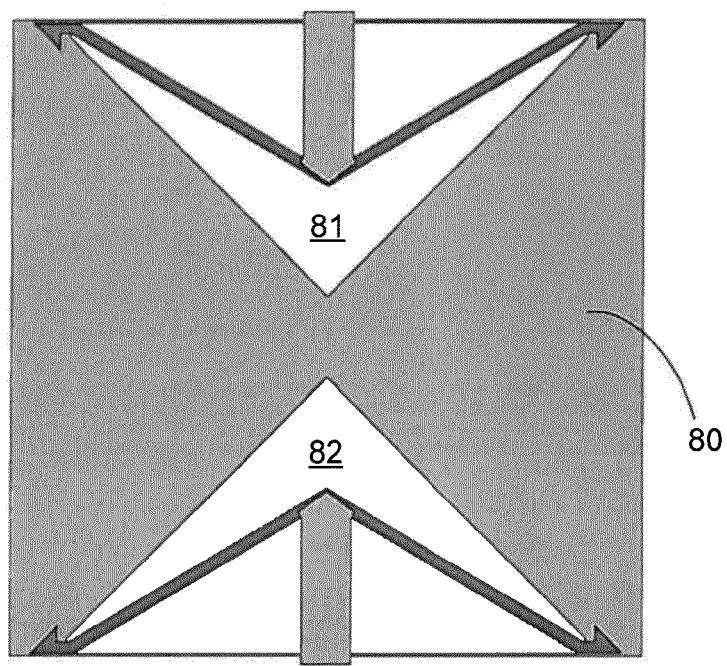
FIG. 26 shows a schematic view of another example embodiment of the unit cell structure of the present invention having only two base cavities and sectors.

Turning now to the drawings, FIGS. 1 and 2 show schematic and isometric views, respectively, of an example 2D embodiment of the unit cell structure of the present invention, generally indicated at 10. Because the unit cell is designed to manage thermal expansion to achieve a desired thermal performance (e.g. positive, negative, or zero expansion), it may be characterized as a thermal expansion-managed structure. The unit cell is shown having a base 11 made of a first material type (e.g. aluminum) and associated first thermal expansion coefficient, shown as $α_1$. The base 11 is shown having four radially-positioned base cavities 12-15 which are open in a radially outward direction at respective cavity openings or mouths 12'-15', respectively. In particular, the base cavities are shown formed by the intersection (at a centroid or other centralized location) of two linear structures, such that each base cavity may be characterized as being positioned between two base struts. However, this is not intended to be limiting, and other base constructions are intended. It is appreciated that at least two radially-positioned base cavities (such as shown in FIG. 26 at reference characters 81 and 82, on opposite sides of base 80) would enable a unit cell structure enabling thermal expansion management in a single linear direction, and that at least three radially-positioned base cavities would be required for thermal expansion management in two dimensions.

Additionally, each base cavity is shown having a flexure bearing positioned across the cavity opening. The flexure bearings include a flexible bridge (e.g. 16-19) connected to the base across the cavity opening, and a tab (e.g. 20-23) connected to the flexible bridge. For example, flexible bridge 16 connects across the cavity opening 12', which as shown in FIG. 1 forms a section of an outer perimeter of the unit cell 10. And tab 20 is connected to the flexible bridge 16, e.g. near a middle of the bridge 16, so as to be guided by the flexible bridge 16 in a direction into or out of the base cavity 12.

And connected to each flexure bearing is an actuator (24-27) for actuating the tab and flexure bearing by thermal expansion. In FIG. 1, the actuator is shown having an exemplary chevron or V-shaped configuration, with a vertex of the actuator connected to an inner end of the tab. For example, tab 20 has an inner end 20" extending into the base cavity 12, with the vertex of actuator 24 connected to the inner end 20" and actuator ends connected to the base 11 near the cavity opening 12'. The actuator is made of a second material type and associated second thermal expansion coefficient, $α_2$, that is greater than the first thermal expansion coefficient of the base. The actuator is operably connected to the corresponding tab and the base so that thermal expansion of the actuator inwardly displaces the tab into the base cavity along a tab displacement axis (orthogonal to a plane defined by the flexible bridges). In particular, the materials and dimensions of the unit cell may be selected so that the inward displacements of the tabs into the respective base cavities along the respective displacement axes due to thermal expansion of the respective actuators are greater than or substantially equal to thermal expansion of the base in a direction of the respective tab displacement axes. This would enable the unit cell to exhibit negative or substantially zero expansion.

Figure 3:
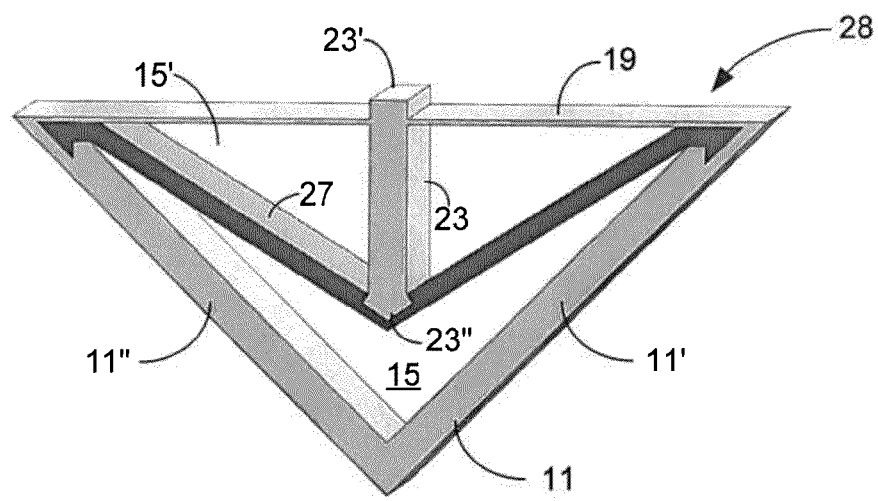
FIG. 3 is an isometric view of a representative sector of the unit cell structure of FIG. 1.

As shown by the broken line in FIG. 1, the unit cell may be characterized as a set of sectors, where each sector is a grouping of a base cavity, and associated cavity opening, flexure bearing, flexible bridge, tab, and actuator. The geometry of the unit cell in FIG. 1 allows it to be divided into four triangular sectors, as shown by the broken line. FIG. 3 shows an isometric view of one representative sector 28 of the 2D unit cell of FIG. 1. The flexible bridge 19 is shown having a blade configuration with the tab 23 connected at or near the middle. In particular tab 23 is shown having one section which extends in an inward direction into the base cavity 15 to an inner tab end 23" connected to the actuator, and another section which protrudes beyond the flexible bridge and an external perimeter of the unit cell. Where the flexible bridge defines the external perimeter, the tab protrusion enables the tab to connect to and interface with a similar tab of an adjacent unit cell. And the base 11 is shown bounding the base cavity 15 with two base struts 11' and 11" which extend to the cavity opening 15' in an exemplary V-shaped configuration with a vertex opposite the cavity opening. It is appreciated that the two base struts 11' and 11" are shared as a common base strut with adjacent sectors.

Figure 4:
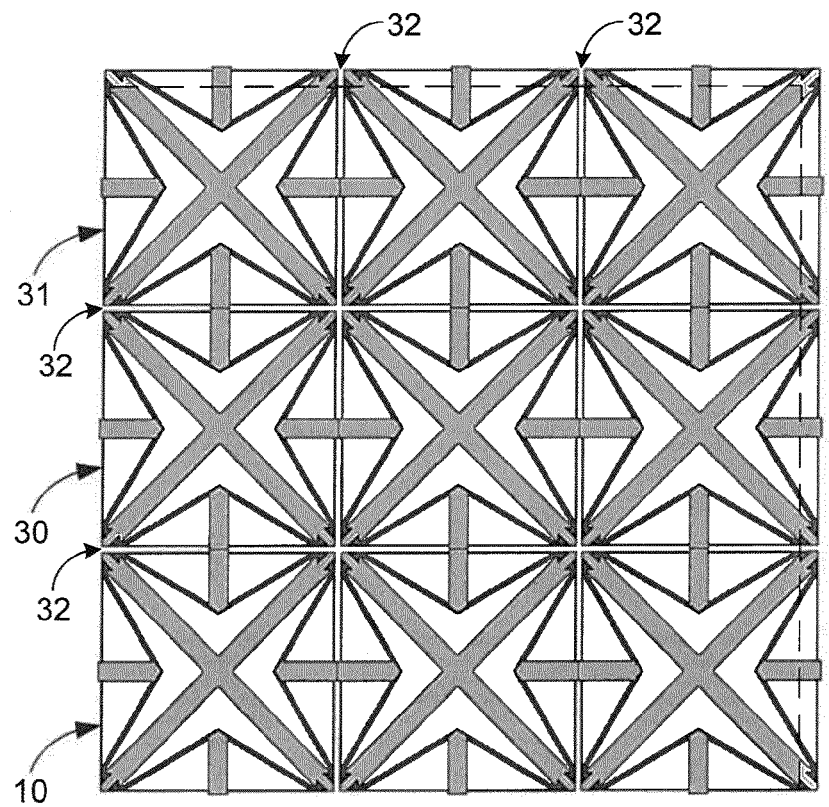
FIG. 4 is a schematic view of an example embodiment of the lattice structure of the present invention comprising a plurality of the unit cells of FIG. 1.

FIG. 4 shows the construction of a lattice structure using multiple unit cells (e.g. 10, 30, and 31) of FIGS. 1-3 as building blocks/constructs. In particular, the unit cells are arranged so that its tabs protrude beyond the flexible bridges to connect with a similar tab of an adjacent unit cell. In particular, a tab of one unit cell is connected to a tab of an adjacent unit cell so that void spaces, e.g. 32, are formed between adjacent unit cells to accommodate thermal expansion of individual unit cells while maintaining a desired bulk thermal expansion coefficient of the lattice structure as a whole. Due to the void space, the inward displacements of the tabs into the respective base cavities along a given displacement axis and the coming closer together of the adjacent unit cells, is accommodated by the void spaced. FIG. 4 show in particular by the dotted line a negative thermal expansion of the lattice structure that is provided by expansion of the unit cells into the void space. The materials and dimensions of the unit cells may be selected so that the inward displacement of the tabs are greater than or substantially equal to thermal expansion of the base in a direction of the displacement axis, so that the desired bulk thermal expansion coefficient of the lattice structure along the displacement axis may be negative or substantially zero, respectively. It is also appreciated that a lattice structure may be constructed of non-uniform unit cells which each have a coefficient of thermal expansion (CTE) that varies (or is graded) across the lattice.

Figure 14:
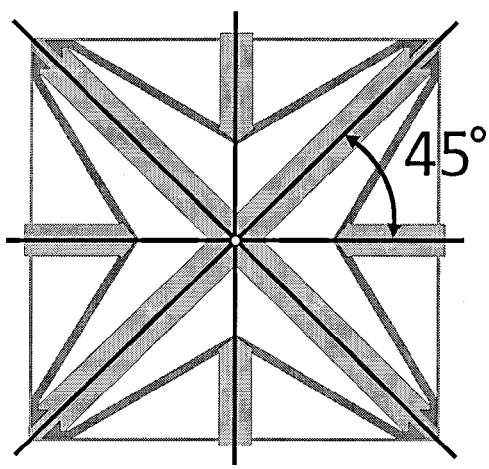
FIG. 14 is a schematic view of an example 2D unit cell of the present invention having a cubic structure with 4 planes of symmetry.
Figure 15:
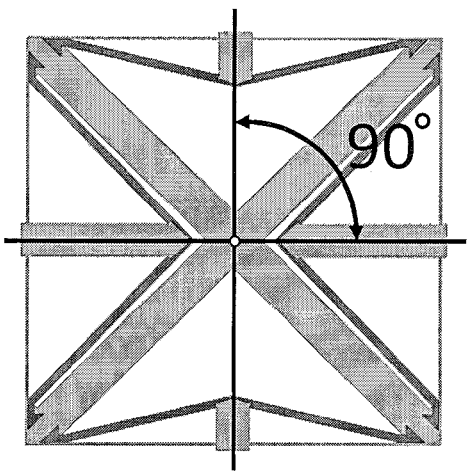
FIG. 15 is a schematic view of an example 2D unit cell of the present invention having an orthotropic structure with 2 planes of symmetry.
Figure 16:
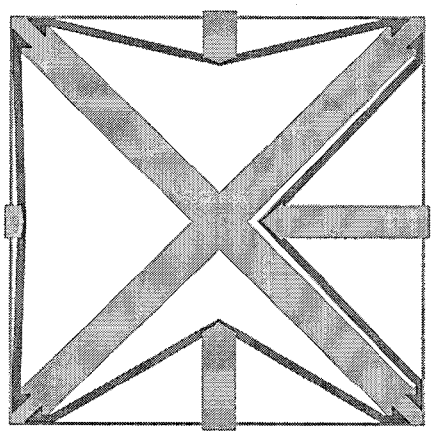
FIG. 16 is a schematic view of an example 2D unit cell of the present invention having a fully anisotropic structure with no plane of symmetry.
Figure 17:
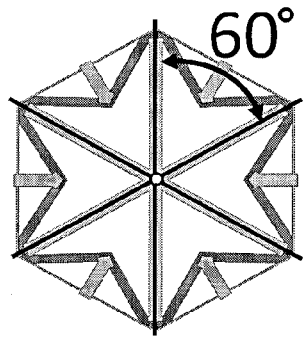
FIG. 17 is a schematic view of an example 2D unit cell of the present invention having an isotropic structure with 3 planes of symmetry.
Figure 18:
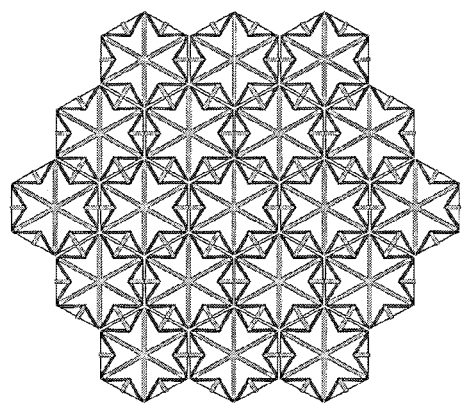
FIG. 18 is a schematic view of an example 2D lattice structure constructed from the unit cells shown in FIG. 17.
Figure 19:
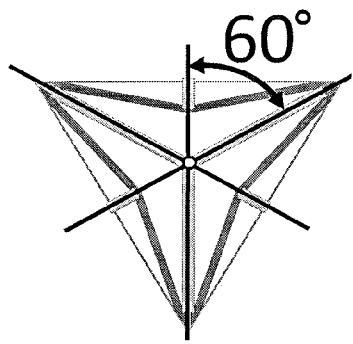
FIG. 19 is a schematic view of an example 2D unit cell of the present invention having an isotropic structure with 3 planes of symmetry.
Figure 20:
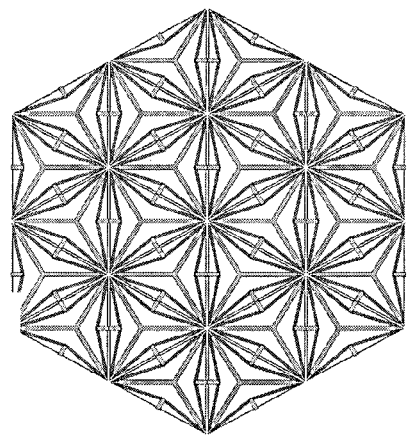
FIG. 20 is a schematic view of an example 2D lattice structure constructed from the unit cells shown in FIG. 19.
Figure 21:
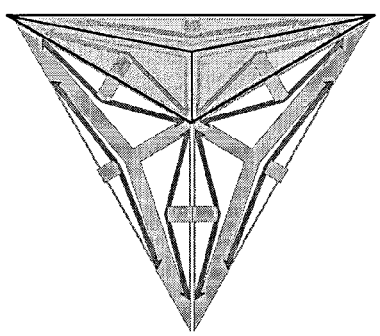
FIG. 21 is a schematic view of an example 2D unit cell of the present invention having an isotropic structure with 3 planes of symmetry, but having irregular sectors.
Figure 22:
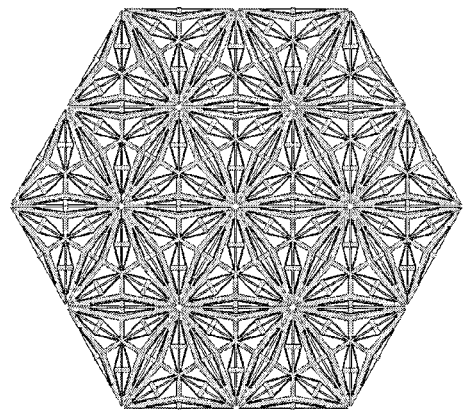
FIG. 22 is a schematic view of an example 2D lattice structure constructed from the unit cells shown in FIG. 21.

It is appreciated that the four sector unit cells shown in FIGS. 1-4 are configured (by geometry, material and dimensional parameter selection) to have four planes of symmetry (see FIG. 14), such that the unit cell may be characterized as a cubic structure. However, it is appreciated that various other symmetrical and non-symmetrical unit cell and lattice structures may be produced by geometry, material, and dimensional selection, such as for example orthotropic structures (e.g. FIG. 15) having two planes of symmetry, isotropic structures (e.g. FIGS. 17-22) having three planes of symmetry, and anisotropic structures (e.g. FIG. 16) having no plane of symmetry.

Figure 5:
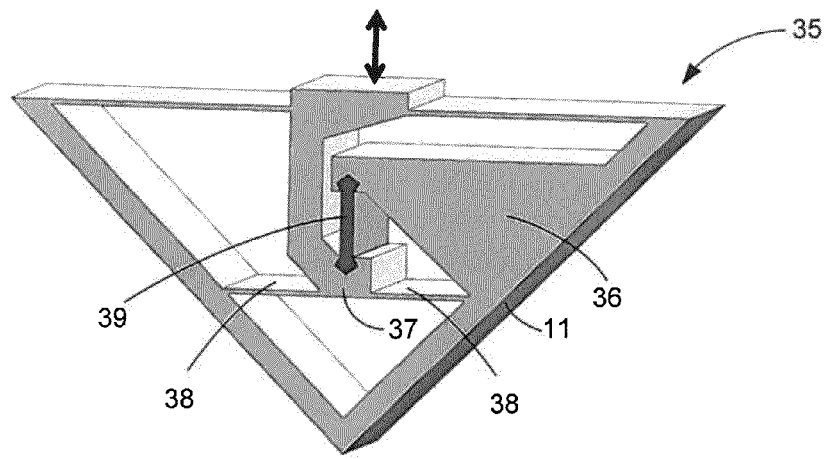
FIG. 5 is an isometric view of another example sector of a unit cell structure of the present invention.
Figure 6:
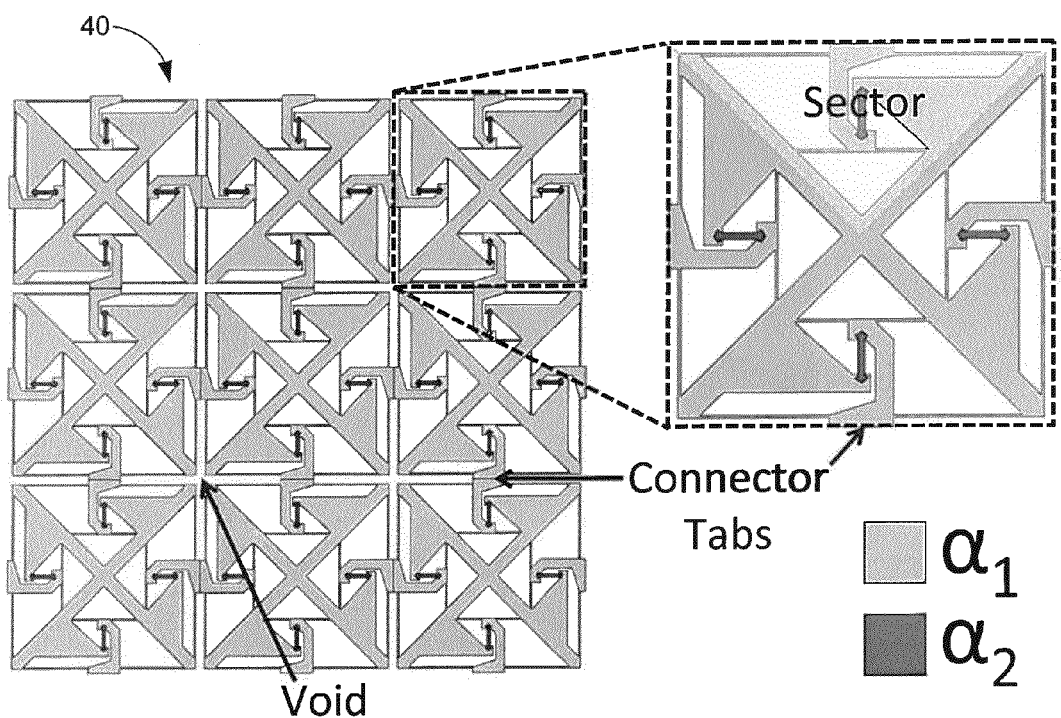
FIG. 6 is a schematic view of an example embodiment of the lattice structure of the present invention comprising a plurality of the unit cells constructed from the sectors shown in FIG. 5.

FIGS. 5 and 6 show another exemplary embodiment of the unit cell and lattice structures of the present invention. In particular, FIG. 5 shows a triangular sector 35 similar to FIG. 3, but having a different actuator operably connected to the tab and base in a different manner than FIG. 3. In particular, the base 11 is shown having an upper arm 36 extending towards a hook-shaped tab in the base cavity, and the hook-shaped tab has a lower portion 37 which is supported by a second flexible bridge 38 of a secondary flexure bearing. A linear actuator 39 is aligned with the direction of tab displacement, and connected at its ends to the lower portion 37 and the upper arm 36, so as to displace the tab inward into the base cavity upon thermal expansion. And FIG. 6 shows a lattice structure 40 constructed by connecting multiple unit cells having four such sectors 35. Similar to FIG. 4, connection between adjacent unit cells is between tabs so as to produce a void space between the unit cells. And FIGS. 7A and 7B show still another exemplary embodiment of a sector and unit cell of the present invention, indicated at 41. Here the tab 42 is shown having an inverted T-shape, with four actuator arms 43 connecting between a lower end portion of the tab to two upper arms 44 and 45 which are extensions of the base.

Figure 9:
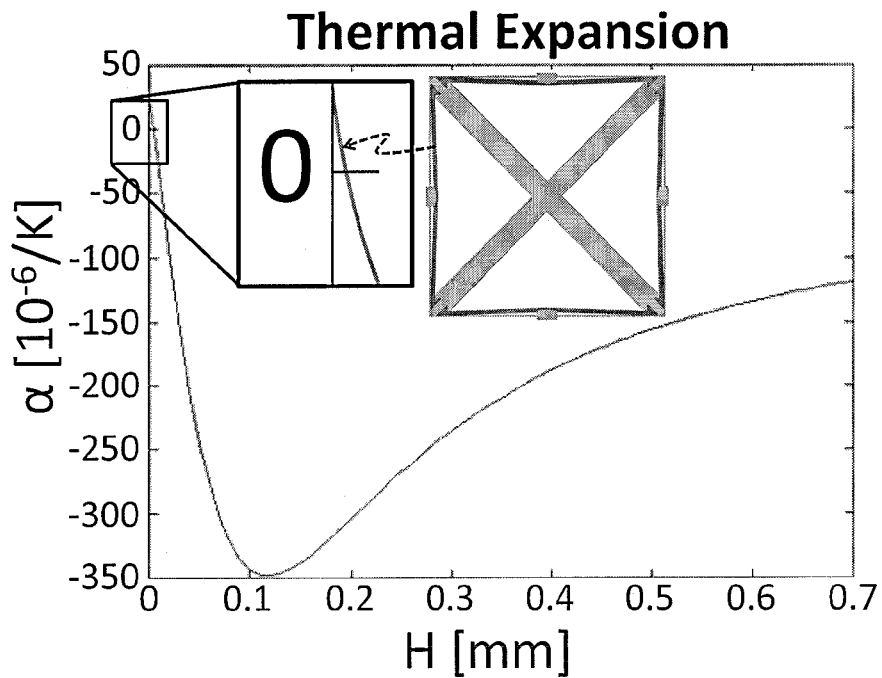
FIG. 9 is a graph plotting the dimension H (in FIG. 8) against thermal expansion coefficient, for a relative thin $t_2$ value of the actuator thickness.
Figure 10:
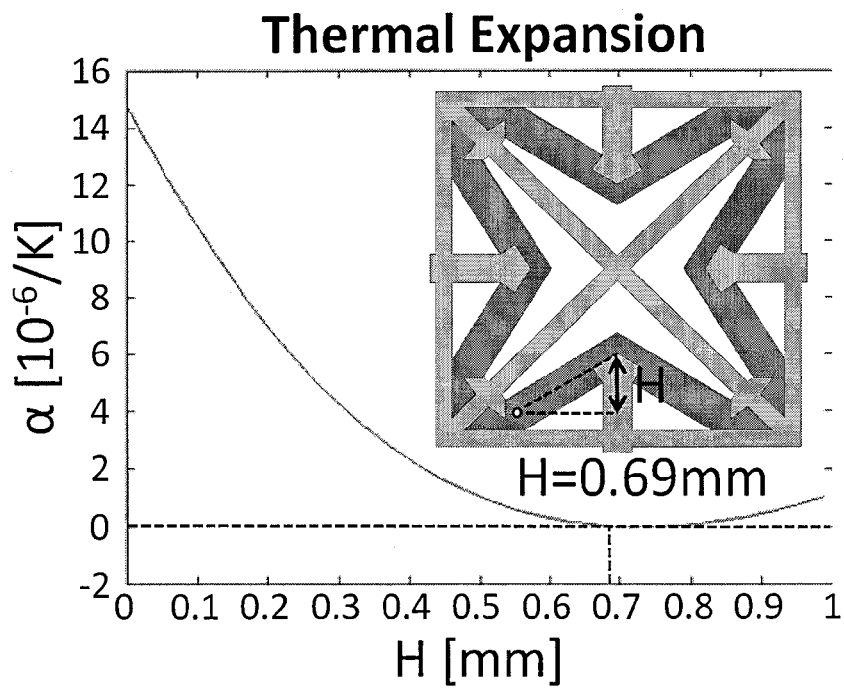
FIG. 10 is a graph plotting the dimension H (in FIG. 8) against thermal expansion coefficient, for a relative thicker $t_2$ value of the actuator thickness, and H=0.69 mm for an aluminum/ABS biomaterial, showing an example of a substantially zero thermal expansion coefficient unit cell structure.
Figure 11:
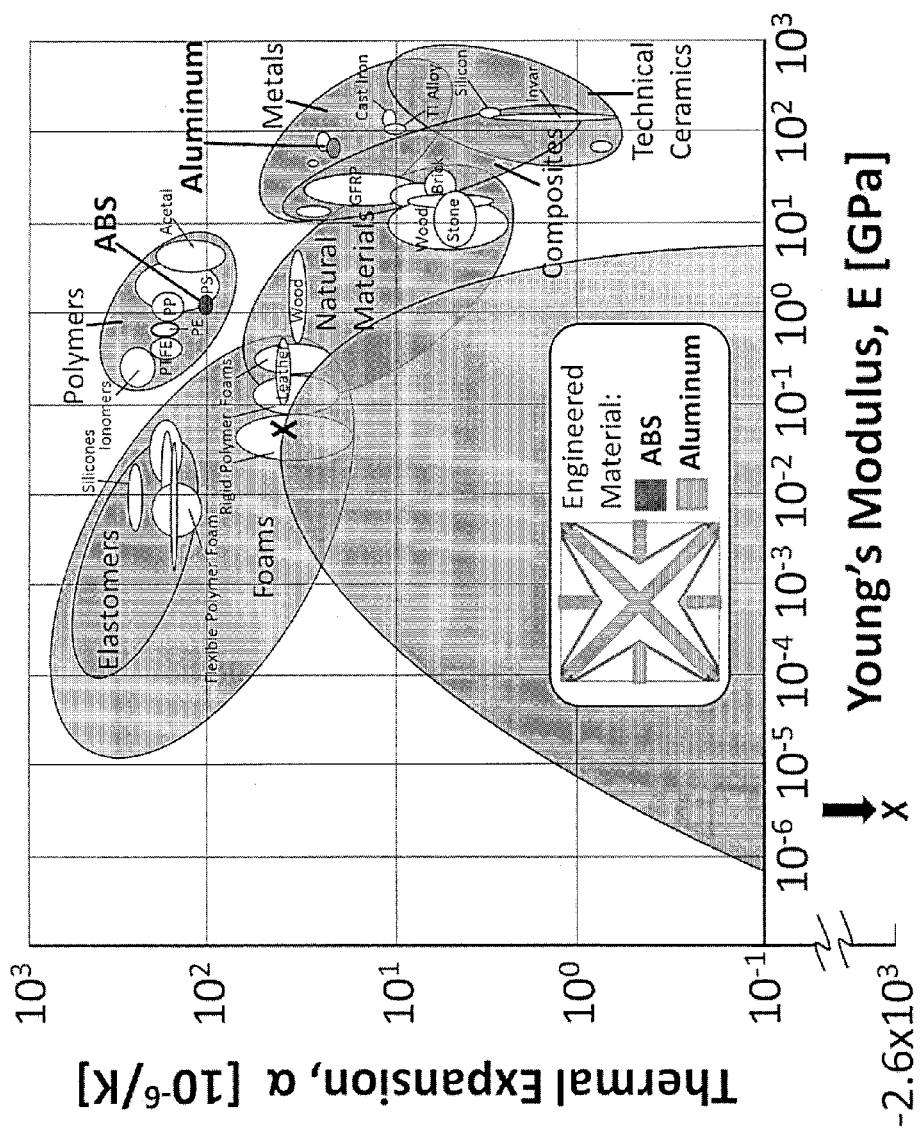
FIG. 11 is a graph showing Young's modulus vs thermal expansion coefficient of an aluminum/ABS engineered unit cell structure compared against various known material.
Figure 13:
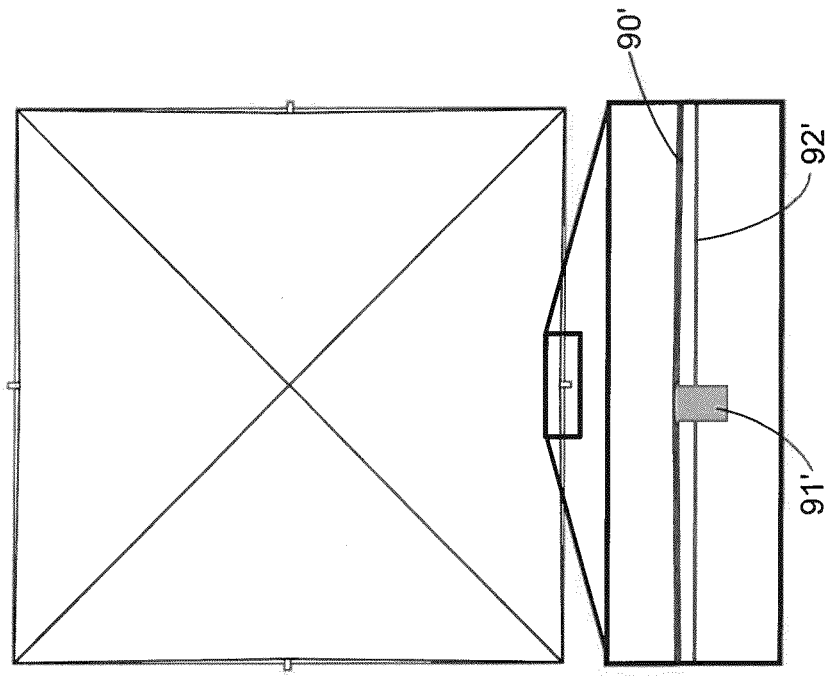
FIG. 13 is a schematic and enlarged views of an example unit cell design of the present invention having the largest negative α.
Figure 12:
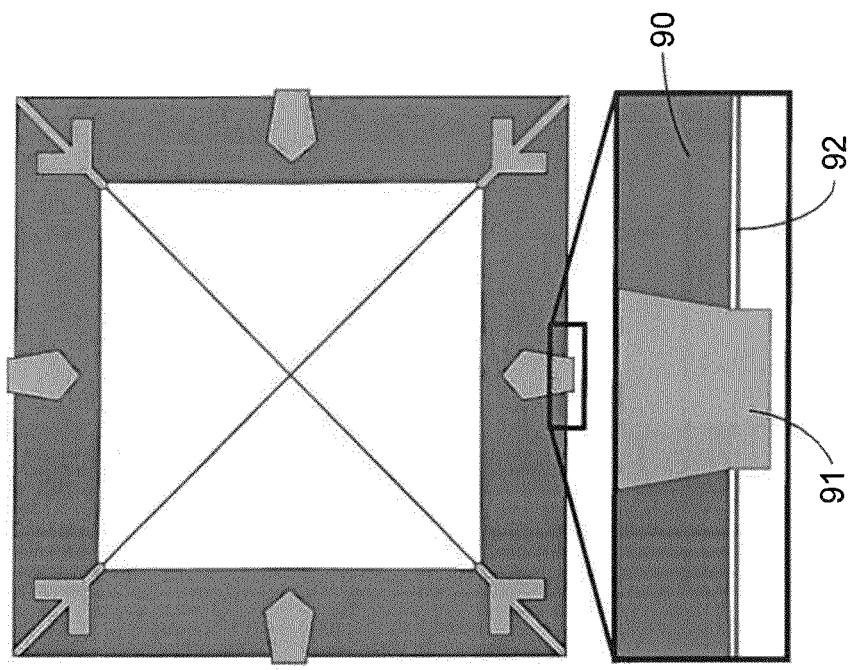
FIG. 12 is a schematic and enlarged views of an example unit cell design of the present invention having the largest positive α.

FIG. 8 shows a unit cell similar to FIG. 1 having dimensional markings for an illustrative 4 mm unit cell. By varying the geometry of the sectors, as well as the material and dimensional parameters thereof (e.g. thickness and length), the unit cell may be designed to exhibit a tailored desired response to thermal expansion. For example, FIG. 9 shows a graph which plot the dimension H (in FIG. 8) against thermal expansion coefficient, for a relative thin $t_2$ value of the actuator thickness. And FIG. 10 is a graph plotting the dimension H (in FIG. 8) against thermal expansion coefficient, for a relative thicker $t_2$ value ($t_2$ of FIG. 9 < $t_2$ of FIG. 10) of the actuator thickness, and H=0.69 mm for an aluminum/ABS biomaterial, showing an example of a substantially zero thermal expansion coefficient unit cell structure. The trend is the greater negative thermal expansion for thinner t2 values FIGS. 12 and 13 show two extreme designs of the present invention, with FIG. 12 showing an exemplary unit cell structure having a very thick $t_2$ dimension of the actuator 90 that is greater than the H dimension of the height of the tab 91, so as to have the largest positive α. The tab 91 is shown connected to flexible bridge 92. With this geometry and dimensions, and with aluminum as the base material and ABS as the actuator material, α has been calculated to about 40 μstrain/K and the Youngs modulus E=0.05 GPa. In contrast, FIG. 13 shows another exemplary unit cell structure having a very thin $t_2$ dimension of actuator 90' with a very low H dimension of the height of the tab 91', to produce a design having the largest negative α. The tab 91' is shown connected to flexible bridge 92'. For example, for this geometry, material selection (ABS and aluminum) and dimensions, α has been calculated at −2600 μstrain/K and E 3e-006 GPa.

Figure 23:
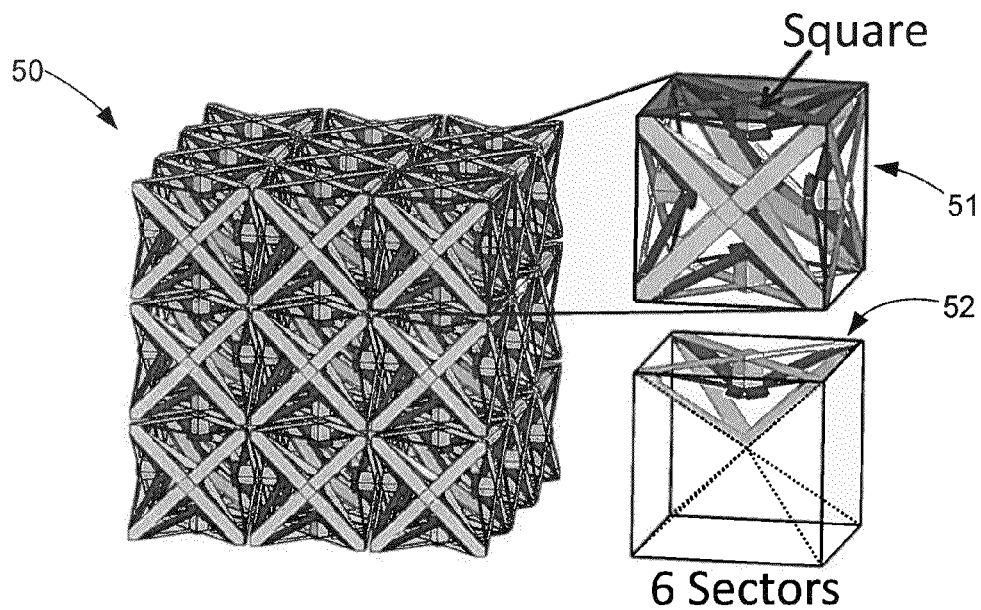
FIG. 23 is a schematic and enlarged views of an example 3D lattice structure constructed from 3D unit cells having a cube-shaped structure with square faces, and 6 sectors.
Figure 24:
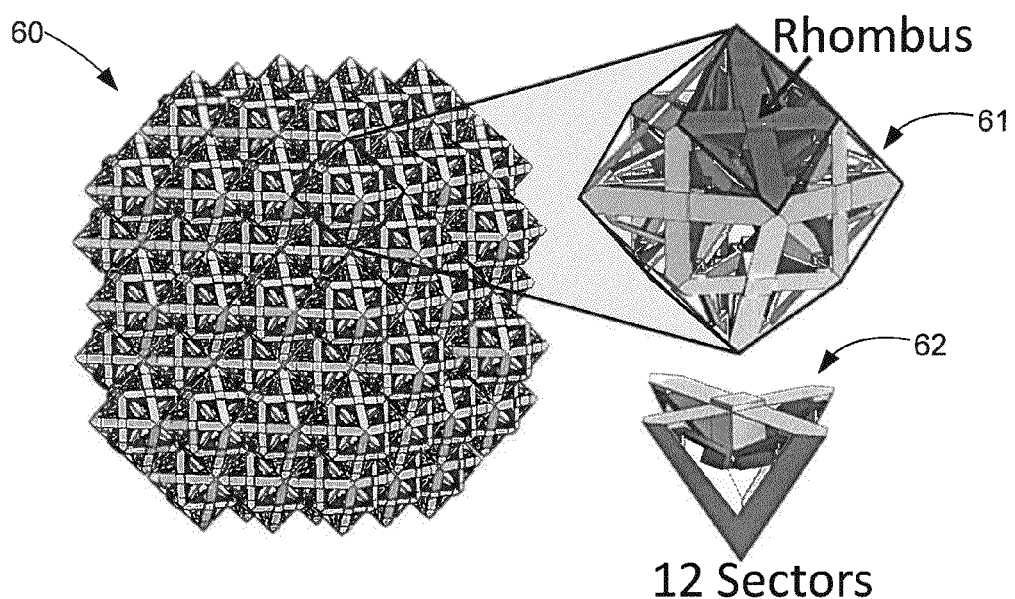
FIG. 24 is a schematic and enlarged views of an example 3D lattice structure constructed from 3D unit cells having a rhombic-shaped structure with rhombus-shaped faces, and 12 sectors.
Figure 25:
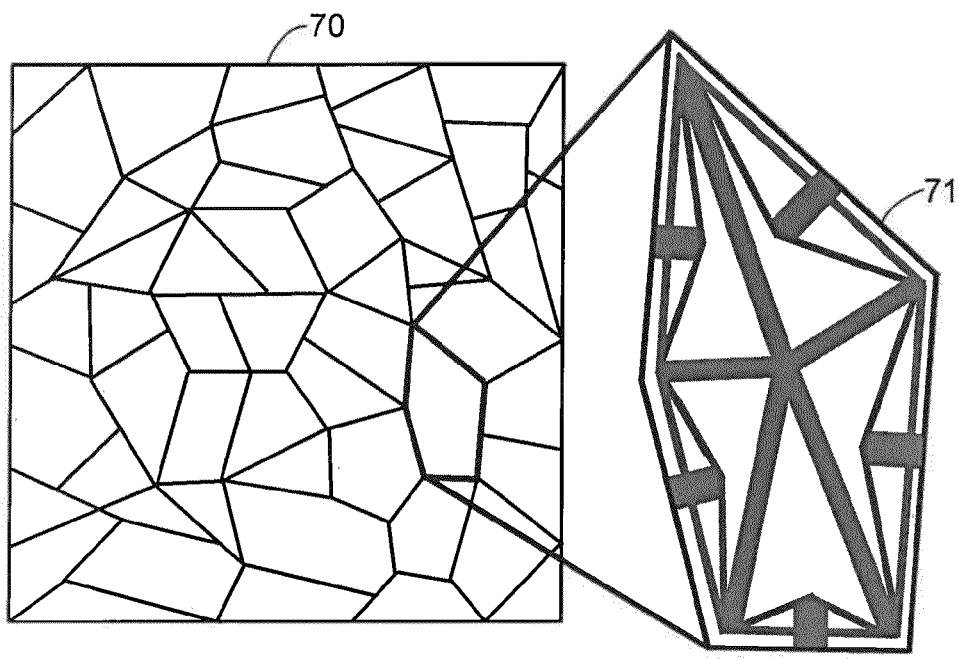
FIG. 25 is a schematic and enlarged views of an example 3D lattice structure constructed from irregular 3D unit cells having irregular unit cell structures with irregular sectors.

The present invention also includes 3D embodiments of the unit cells and lattice structures of the present invention, as shown by the example embodiments of FIGS. 23-25. In particular, FIG. 23 shows a 3D lattice structure 50 formed by connecting the tabs of adjacent unit cells 51 which are shown having a cube-shaped configuration. The base cavity of the 3D unit cell is shown bounded by four base struts (at least three required) extending to the cavity opening and to a plane formed by strut ends of the at least three base struts, to form a pyramid-shaped base cavity with a vertex opposite the cavity opening. The pyramid-shaped base cavity also forms the pyramid-shaped sector 52, with 6 sectors forming the unit cell 51. And the base portion of the pyramid-shaped based cavity is shown having a square geometry. In contrast, another 3D lattice structure 60 is shown in FIG. 24 having another generally rhombic-shaped unit cell 61 having a similar base portion of the pyramid-shaped base cavity having a rhombus geometry. And in this case twelve sectors 62 are shown used to form the unit cell 61. And FIG. 25 is a schematic and enlarged views of an example 3D lattice structure 70 constructed from irregular 3D unit cells (e.g. 71) having irregular unit cell structures with irregular sectors.

Although the description above contains many details and specifics, these should not be construed as limiting the scope of the invention or of what may be claimed, but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A lattice structure comprising:
a plurality of unit cells, each comprising a base, of a first material type and associated first thermal expansion coefficient, having at least three radially-positioned base cavities which are open in a radially outward direction at respective cavity openings, and for each base cavity: a flexible bridge connected to the base across the cavity opening; a tab connected to the flexible bridge so as to be guided thereby in a direction into or out of the base cavity; and an actuator, of a second material type and associated second thermal expansion coefficient greater than the first thermal expansion coefficient, operably connected to the tab and the base so that thermal expansion of the actuator inwardly displaces the tab into the base cavity along a tab displacement axis,
wherein a tab of one unit cell is connected to a tab of an adjacent unit cell so that void spaces are formed between adjacent unit cells to accommodate thermal expansion of individual unit cells while maintaining a desired bulk thermal expansion coefficient of the lattice structure as a whole.

2. The lattice structure of claim 1,
wherein the inward displacements of the tabs into the respective base cavities along a given displacement axis due to thermal expansion of the respective actuators are greater than or substantially equal to thermal expansion of the base in a direction of the displacement axis, so that the desired bulk thermal expansion coefficient of the lattice structure along the displacement axis may be negative or substantially zero, respectively.

3. The lattice structure of claim 1,
wherein each of the tabs extend from the respective flexible bridges into the respective base cavities to an inner tab end, and
wherein each of the actuators has a V-shaped cross-section with actuator ends connected near the cavity opening and a vertex connected to the inner tab end.

4. The lattice structure of claim 1,
wherein each unit cell has at least three groupings of base cavity, cavity opening, flexible bridge, tab, and actuator, with each grouping defining a radially-positioned sector of the unit cell, and
wherein material and dimensional parameters of the sectors are selected to form a unit cell structure type and corresponding lattice structure type selected from a group consisting of a cubic structure having four planes of symmetry, an orthotropic structure having two planes of symmetry, an isotropic structure having three planes of symmetry, and an anisotropic structure having no plane of symmetry.

5. The lattice structure of claim 1,
wherein each base cavity is bounded by two base struts extending to the cavity opening with the base cavity therebetween, with adjacent base cavities sharing a common base strut.

6. The lattice structure of claim 5,
wherein the two base struts are arranged in a V-shaped configuration with a vertex opposite the cavity opening.

7. The lattice structure of claim 1,
wherein each base cavity is bounded by at least three base struts extending to the cavity opening and to a plane formed by strut ends of the at least three base struts.

8. The lattice structure of claim 7,
wherein each base cavity is bounded by four base struts extending to the cavity opening to form a pyramid-shaped base cavity with a vertex opposite the cavity opening.

9. The lattice structure of claim 1,
wherein the unit cells have non-uniform thermal expansion coefficients so that thermal expansion coefficient is graded across the lattice structure.

10. A lattice structure comprising:
at least two unit cells, each comprising a base, of a first material type and associated first thermal expansion coefficient, having at least two radially-positioned base cavities which are open in a radially outward direction at respective cavity openings, and for each base cavity: a flexible bridge connected to the base across the cavity opening; a tab connected to the flexible bridge so as to be guided thereby in a direction into or out of the base cavity; and an actuator, of a second material type and associated second thermal expansion coefficient greater than the first thermal expansion coefficient, operably connected to the tab and the base so that thermal expansion of the actuator inwardly displaces the tab into the base cavity along a tab displacement axis,
wherein a tab of one unit cell is connected to a tab of an adjacent unit cell so that void spaces are formed between adjacent unit cells to accommodate thermal expansion of individual unit cells while maintaining a desired bulk thermal expansion coefficient of the lattice structure as a whole.

11. A thermal expansion-managed structure comprising:
a base, of a first material type and associated first thermal expansion coefficient, having at least three radially-positioned base cavities which are open in a radially outward direction at respective cavity openings;
for each base cavity: a flexible bridge connected to the base across the cavity opening of the base cavity; a tab connected to the flexible bridge so as to be guided thereby in a direction into or out of the base cavity; and an actuator, of a second material type and associated second thermal expansion coefficient greater than the first thermal expansion coefficient, operably connected to the tab and the base so that thermal expansion of the actuator inwardly displaces the tab into the base cavity along a tab displacement axis.

12. The thermal expansion-managed structure of claim 11, wherein the inward displacements of the tabs into the respective base cavities along the respective displacement axes due to thermal expansion of the respective actuators are greater than or substantially equal to thermal expansion of the base in a direction of the respective tab displacement axes.

13. The thermal expansion-managed structure of claim 11, wherein each of the tabs extend from the respective flexible bridges into the respective base cavities to an inner tab end, and
wherein each of the actuators has a V-shaped cross-section with actuator ends connected near the cavity opening and a vertex connected to the inner tab end.

14. The thermal expansion-managed structure of claim 11, wherein the structure has at least three groupings of base cavity, cavity opening, flexible bridge, tab, and actuator, with each grouping defining a radially-positioned sector of the structure, and
wherein material and dimensional parameters of the sectors are selected to form a structure type selected from a group consisting of a cubic structure having four planes of symmetry, an orthotropic structure having two planes of symmetry, an isotropic structure having three planes of symmetry, and an anisotropic structure having no plane of symmetry.

15. The thermal expansion-managed structure of claim 11, wherein each base cavity is bounded by two base struts extending to the cavity opening with the base cavity therebetween, with adjacent base cavities sharing a common base strut.

16. The thermal expansion-managed structure of claim 15, wherein the two base struts are arranged in a V-shaped configuration with a vertex opposite the cavity opening.

17. The thermal expansion-managed structure of claim 11, wherein each base cavity is bounded by at least three base struts extending to the cavity opening and to a plane formed by strut ends of the at least three base struts.

18. The thermal expansion-managed structure of claim 17, wherein each base cavity is bounded by four base struts extending to the cavity opening to form a pyramid-shaped base cavity with a vertex opposite the cavity opening.

* * * * *